United States Patent [19]

Bansemir

[11] Patent Number: 4,792,079
[45] Date of Patent: Dec. 20, 1988

[54] APPARATUS FOR ULTRASONIC WIRE BONDING

[75] Inventor: Manfred Bansemir, Dresden, German Democratic Rep.

[73] Assignee: VEB Elektromat Dresden, Dresden, German Democratic Rep.

[21] Appl. No.: 130,053

[22] Filed: Dec. 8, 1987

[30] Foreign Application Priority Data

Feb. 25, 1987 [DD] German Democratic Rep. .................................. 3001486

[51] Int. Cl.⁴ .............................................. B23K 20/10
[52] U.S. Cl. ...................................... 228/1.1; 228/4.5; 228/45; 228/110; 219/56.21
[58] Field of Search ...................... 228/1.1, 4.5, 45, 32, 228/904, 110; 219/56.1, 56.21

[56] References Cited

U.S. PATENT DOCUMENTS 4,239,144 12/1980 Elles et al. ............................ 228/1.1
4,351,468 9/1982 Floury et al. ...................... 219/56.1

Primary Examiner—Nicholas P. Godici
Assistant Examiner—Samuel M. Heinrich
Attorney, Agent, or Firm—Jordan and Hamburg

[57] ABSTRACT

The invention relates to an apparaus for ultrasonic wire bondings whereby the contact loci can be connected by wire straps, by means of ultrasonic welding, e.g. for connecting terminals on component mounts or the like to bonding islands on semiconductor chips. The inventive apparatus has means for combined axial and radial guiding of the rotatable bonding head, with low overall mass of the vertically movable parts and low moment of inertia around the rotational axis. As a result of the inventive disposition of the microscope objective, the object distance to the component can be set directly via the controllable vertical drive of the bonding head.

9 Claims, 3 Drawing Sheets

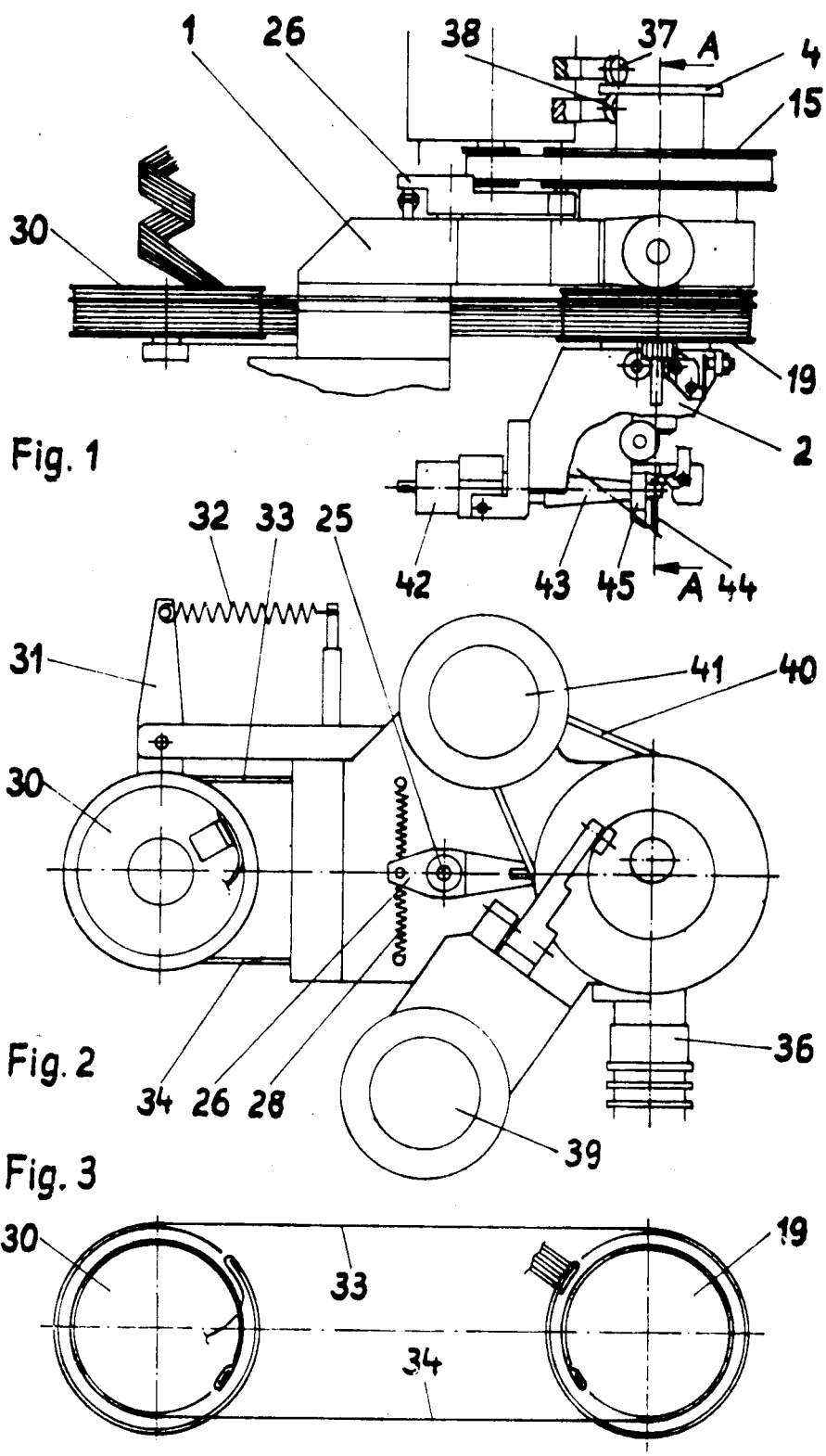

APPARATUS FOR ULTRASONIC WIRE BONDING

BACKGROUND OF THE INVENTION

The invention relates to an apparatus for ultrasonic wire bonding, whereby contact locations can be joined by ultrasonic welding and wire straps, e.g. connections from component mounts or the like to the bonding islands of semiconductor chips.

With known apparatuses for ultrasonic wire bonding, as a rule the wire is fed through an inclined bore in the longitudinal direction of the ultrasonic generator, which bore is disposed behind the welding surface of a sonotrode. This customary arrangement requires that prior to the fixing of each wire strap the connecting orientations at the two connecting loci of the strap must be aligned with the axial direction of the ultrasound generator.

For this purpose, either the component mount or a bonding head which includes the ultrasound generator must be aligned in the required direction. When automatic apparatus is used for certain areas of application, e.g. for operations on so-called hybrid components, it is advantageous to proceed by adjusting the bonding head. Known apparatuses of this type have a bonding head which is rotatable around a vertical axis which axis approximately passes through the welding surface at the foot of the sonotrode, wherewith the bonding head as a rule is also movable vertically. In addition, all known embodiments have an optical device disposed near the axis of rotation, whereby the component being operated on can be depicted on a monitor by means of a television camera.

In a device well known in practice (described in U.S. Pat. No. 4,239,144), a hollow shaft is provided which is disposed on two radial bearings, for radial guiding of the bonding head, which shaft has a downwardly directed fixed connecting member. A carriage is mounted on this fixed connecting member, which carriage is vertically movable in ball bearings and which bears the bonding head proper. A bar mounted in the rotational pivot is provided, for coupling the carriage to the vertical drive means. Said bar passes through the center bore of a rod which is fixed to the machine frame and which extends into the hollow shaft from above. This rod further has an eccentrically disposed bore, in the bottom of which a lens system is mounted which serves an an objective.

A disadvantage of this arrangement is that the axis of the objective is at a relatively large lateral distance from the rotational axis. Therefore the movement path between the viewing position and bonding position (for any given bonding position and given viewing position) for the connecting points of the component is substantial. Also, the diameters of the radial bearings are relatively large, so that the structure has a large moment of inertia, and the lens system must have a relatively small diameter, rendering impossible the use of a normal objective.

Also well known in practice is a device wherein the bonding head is fixedly mounted on a subassembly comprised of the radial guide means and the drive means for the rotational movement. This subassembly is attached to a vertically guided carriage which executes the vertical movement. A disadvantage of this arrangement is particularly that the mass which must be moved vertically is high, thereby limiting the possible speed of operation.

SUMMARY OF THE INVENTION

The object of the invention is to devise an apparatus for ultrasonic wire bonding, with the aid of which apparatus higher operating speeds are attainable in the execution of ultrasonically welded wire bonds by automatic means employing a rotatable bonding head; and whereby favorable conditions are created for automatic determination of the positions of the components being operated on.

The present invention therefore provides an apparatus for wire bonding, which apparatus comprises a head which is guided radially and axially and is rotatable, whereby the overall mass of the vertically movable parts and the moment of inertia around the rotational axis are less than in known apparatuses. The present invention also provides that, for optical imaging, a customary microscope objective having high resolving power may be mounted near the rotational axis of the bonding head, and said objective can be automatically moved to the required distance from the plane of the connecting location on the component being operated on, which distance is required for sharp imaging.

The point of departure from the prior art is to provide a wire bonding apparatus having a bonding head which is essentially comprised of an ultrasound generator with a sonotrode and a gripping mechanism for advancing and cutting the wire. The bonding head is movable vertically in the direction of the sonotrode axis, and is rotatable around an axis parallel to the sonotrode axis and approximately passing through the weld surface at the foot of the sonotrode.

The present invention provides that the bonding head is attached to the lower end face of a cylindrical piece which is concentric with the axis of rotation. The cylindrical piece is held firmly in a bushing, and has a flange at its upper end for engaging drive means which produce the vertical movement. The bushing is disposed in a radial bearing which is adjustable without play, which bearing is provided with a ball-bearing cage and bearing balls whereby said bushing is longitudinally movable without play in the inner race member of said bearing, wherewith said bearing operates as a two-row angular-contact ball bearing. A drum for accommodating the electrical leads for the bonding head is attached to the lower end face of the inner race member, and a toothed-belt pulley is affixed to the upper end face of said race member. Also, a rod is eccentrically mounted on the drum. Two rollers disposed on the bonding head rest against said rod.

A second rod is mounted on the toothed-belt pulley, such that the range of movement of said second rod intersects (or overlaps) the range of movement of the end member of a lever held, by springs, in a radial orientation with respect to the rotational axis. The said end member is in the form of a transverse piece or lug.

In addition, a fixed detent is disposed such that the rotational movement of the lever is fixedly limited. The cylindrical piece (mentioned supra) and the flange have an eccentrically disposed bore running parallel to the axis, with a microscope objective being screwed into the lower region of said bore.

The present invention functions as follows:

The inner race member of the adjustable two-row angular-contact ball bearing serves as a radial guide means, and simultaneously as a guide bushing for a concentric longitudinal guide means. In particular, the longitudinal guide means is comprised of an outer bushing (comprising the inner race member of the radial guide means), an inner bushing with tapered ends, and, between the outer and inner bushing, a ball-bearing cage with bearing balls, for play-free longitudinal guiding of the inner bushing.

The flange attached to the cylindrical member serves to receive the means for actuation of the vertical movement.

The bonding head mounted in the longitudinal guide means via the cylindrical piece is coupled to rotational movement means provided by the radial guide means in that the rollers disposed on the bonding head rest against the rod mounted in the drum which rod is parallel to the rotational axis, namely said rollers rest against the rod on both sides of said rod. This causes the bonding head to follow the rotational movement of the drum which drum is attached to the inner race member of the radial guide means. This rotational linkage to the bonding head is independent of the vertical position of said bonding head.

In order to ensure exactly reproducible positioning of the objective in an x-y coordinate system having its origin at the rotational axis, when the bonding head is in the base position, the rotational movement of the bonding head in one direction is fixedly limited. This limitation is accomplished in that the rod mounted in the toothed-belt pulley engages the transverse end member of the lever which is held in a radial orientation with respect to the rotational axis, and said rod presses said lever end member against the fixed detent in the direction of movement in question. The fixed detent is outside the range of movement of the rod.

The disposition of the microscope objective is such that the object distance to the component (workpiece) can be set directly by the controllable vertical drive of the bonding head, wherein no additional guide or drive elements are required for such setting.

The disposition of the microscope objective further allows the objective axis to be positioned as closely as possible to the rotational axis, so that even when an ordinary microscope objective is used the diameter of the cylindrical piece mounted in the longitudinal guide means can be kept small. The resulting small diameter of the concentric longitudinal guide means, along with the fact that the radial and longitudinal guide means are combined, allows a lower total mass of the vertically movable parts and a lower moment of inertia about the rotational axis (of the bonding head) than is possible with known apparatuses.

In an advantageous refinement of the invention, a semisilvered mirror is disposed in a bore in the cylindrical piece, which bore is eccentrically disposed in said piece and is parallel to the axis, wherein the mirror is oriented at 45° to the axis of said bore. Further, the cylindrical piece, the bushing, the ball-bearing cage, the inner race member, and the outer race member (of the radial bearing which operates as an angular-contact ball bearing), all have transverse bores at the altitude of the center of the mirror. This enables one to illuminate the object disposed under the microscope objective by means of an illuminating device disposed outside the radial bearing, to provide top illumination of said object when the bonding head is in the position defined as the base position.

According to another advantageous refinement of the invention, the aforesaid drum has two regions separated by a ridge, and a second rotatable drum is provided in the apparatus, wherein the electrical leads and an electrically inactive tensile cable are each attached to one of the drums at respective ends thereof, and are guided and partially wound, in opposite directions, such that each comprises a tensile cord of a closed tensile drive connected to one of the two drums.

BRIEF DESCRIPTION OF THE DRAWING

The invention will be described in more detail hereinafter with reference to the accompanying drawings.

FIG. 1 is a side view of the apparatus;

FIG. 2 is a plan view of the apparatus;

FIG. 3 is a schematic depiction of the electrical leads to the bonding head;

DETAILED DESCRIPTION OF THE PREFERRED EMBODIMENT

Figure 4:
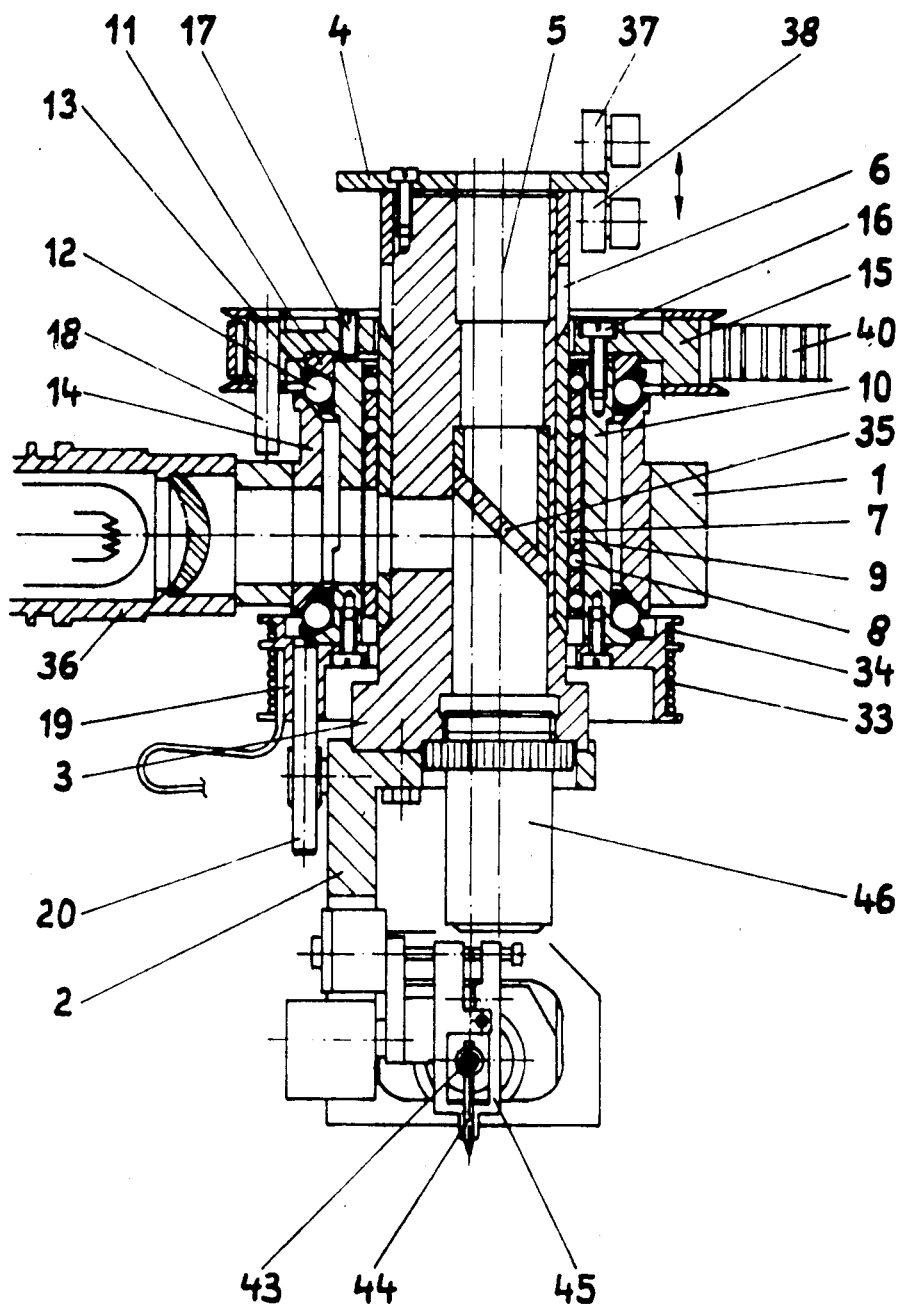
FIG. 4 is a cross section through line A—A of FIG. 1, which cross section passes through the rotational axis of the bonding head.
Figure 5:
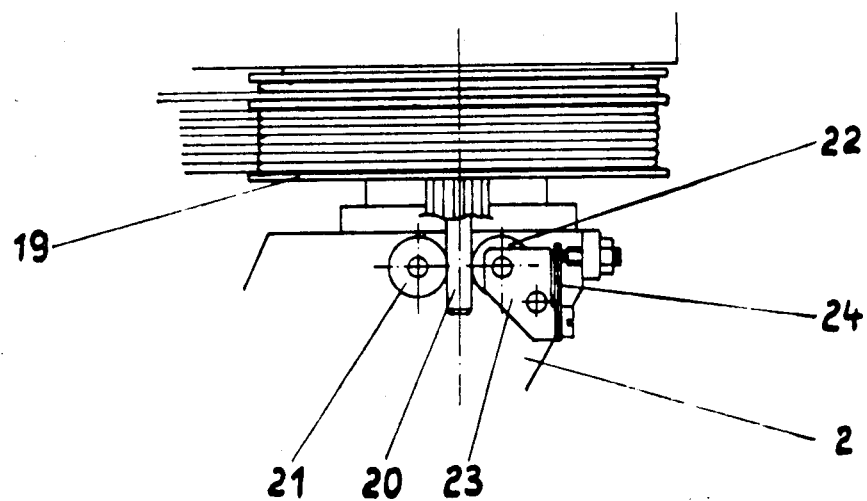
FIG. 5 is a partial side view of the bonding head.
Figure 6:
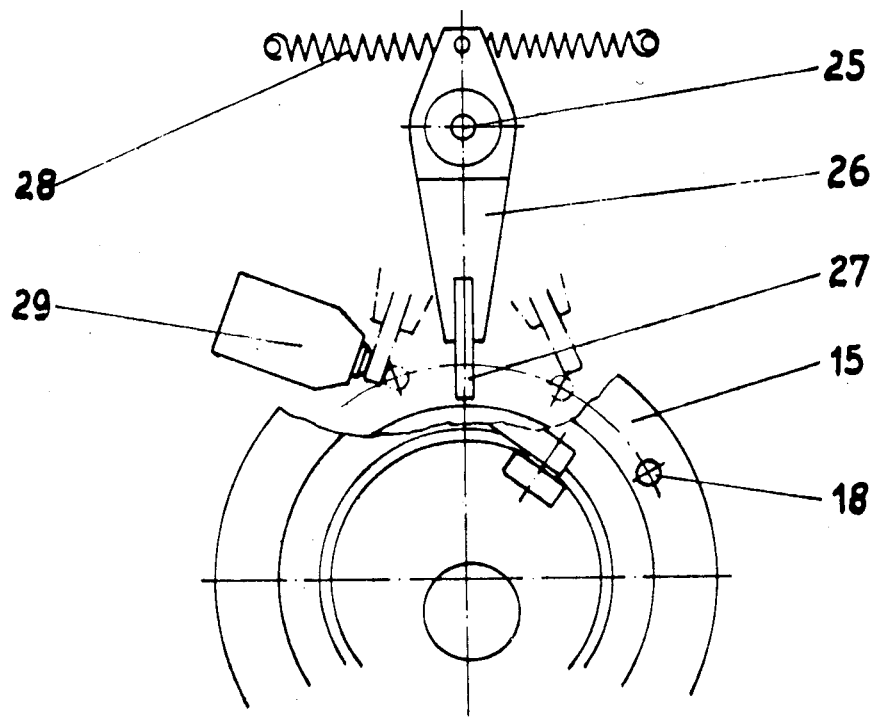
FIG. 6 is a partial plan view showing the limiting of the rotational angle.

The apparatus for ultrasonic wire bonding according to FIGS. 1-6 is mounted on a base member 1 in a frame (not shown), wherewith said subject apparatus may be disposed either fixed or on a table movable in the x-y direction.

A bushing 14 is held in the base member 1, and serves as the outer race member of a two-row ball bearing which also comprises an inner race member 10, a tapered race member 11, and two ball-bearing cages 13 with balls 12. This bearing serves as the radial guide means for the bonding head 2. A toothed-belt pulley 15 rests on the tapered race member 11 and is fastened to the inner race member 10 by screws 16, while being braced against member 10 by threaded pins 17 disposed between said screws. In this way the radial guide means can be adjusted to eliminate play, by appropriate adjustment of the threaded pins 17.

The inner race member 10 also serves as an outer bushing for a concentric longitudinal guide means comprised of a bushing 7, ball bearing cage 9, and balls 8.

The bonding head 2 is essentially comprised of an ultrasound generator 42 with a bonding snout 43 and a sonotrode 44, mounting means for the ultrasound generator, and a gripping mechanism 45 for advancing and cutting the wire. Head 2 is mounted on the end face of a cylindrical piece 3 such that the axis of piece 3 is parallel to the sonotrode axis and runs approximately through the welding surface at the foot of the sonotrode 44.

The bushing 7 has interior bevels on its end faces. The cylindrical piece 3 is inserted into bushing 7 until a tapered shoulder on piece 3 lodges against the bevel on bushing 7. A clamping sleeve 6 is slid over the end of piece 3 which end extends beyond the bushing 7. Sleeve 6 has a tapered end face and has slots (or similar openings) in it. It extends slightly beyond the end of piece 3. A flange 4 which rests on the sleeve 6 is forced against (or toward) the end face of the cylindrical piece 3 by srews, thereby forcing the piece 3 against the inner bevel of bushing 7. Flange 4 also serves as (an initial transmitting) member for transmitting the controllable vertical movement for the bonding head 2. For this purpose, two rollers 37 and 38 engage the outer region of the faces of flange 4, which rollers are connected by lever(s) to a worm drive on the drive motor 39 mounted on the base member 1.

The cylindrical piece 3 and flange 4 have an eccentric bore 5 into which a microscope objective 46 is screwed from below. A semi-silvered mirror 35 may be mounted above the microscope objective 46, at 45° to the axis thereof. The piece 3, bushing 7, ball-bearing cage 9, inner race member 10, and bushing 14 have transverse bores at the altitude of the center of the mirror. The object disposed under the objective 46 may be illuminated, via mirror 35, by means of an illuminating device 36 disposed outside the bushing 14 on the base member 1 such illumination being effected when the apparatus is in the azimuthal orientation with respect to the bushing 14 which orientation is shown in FIG. 4 and corresponds to the base position of the bonding head 2.

The controllable rotational movement for the bonding head 2 is transmitted to the toothed-belt pulley 15 and thereby to the inner race member 10, from a drive motor 41 mounted on the base member 1, said transmission being by means of a toothed belt 40. A drum 19 divided into two regions by ridges is attached to the bottom end face of the inner race member 10. Drum 19 serves to attach and guide flexible electrical leads 33 for the bonding head 2. The leads 33 are attached in the lower region of drum 19 and in the lower region of another similar drum 30 disposed on the base member 1, and are partially wound around said drums. In the upper region of drums 19 and 30, an electrically inactive tensile cable 34 is also attached and is partially wound in the opposite winding direction. Accordingly, the leads 33 and tensile cable 34 each form a tensile cord operative in a closed tensile drive, as illustrated in FIG. 3. FIG. 3 also quite clearly indicates the two superposed regions of the drums 19 and 30, which regions have different diameters.

The drum 30 is rotatably mounted on a lever 31, and the tensile cables are tensed via a spring 32 acting on said lever. A rod 20 disposed in the drum 19 is attached to the inner race member 10, which rod is parallel to the rotational axis. Two rollers 21 and 22 disposed on the bonding head 2 rest against the side of rod 20, whereby the rotational movement is transmitted to the bonding head 2 and to the cylindrical piece 3 connected to bonding head 2. One of the two rollers 21 and 22 is fixed and the other is preferably forced against rod 20 by prestressed spring means. Accordingly, in the exemplary embodiment illustrated the roller 22 is rotatably mounted on a lever 23 which is urged by sheet springs 24.

A lever 26 is rotatably mounted on a pivot 25 which extends parallel to the rotational axis, on the base member 1. The end of lever 26 is in the form of a transverse member 27, which is held in a radial orientation with respect to the rotational axis by means of springs 28 which engage lever 26. Member 27 extends into the range of movement of a rod 18 mounted in the toothbelt pulley 15, which rod 18 is parallel to the rotational axis. Lever end 27 can be engaged by the rod 18 and pressed outward against the action of the springs 28. In the course of such action in the rotational direction, lever end 27 is pressed against a fixed detent 29 disposed on base member 1, whereby lever end 27 limits the rotational movement in this direction. The detent 29 is outside the range of movement of the rod 18. In the opposite rotational direction, the rotational movement is not limited. To ensure an exactly reproducible angular position in the base position of the bonding head 2, the radial guide means is pulled against the fixed limit by the drive motor 41, with constant torque.

I claim:
1. An apparatus for ultrasonic wire bonding comprising:
 (a) a bonding head including
  (i) an ultrasonic generator,
  (ii) a sonotrode having an axis and a foot which defines a weld surface, and
  (iii) gripping means for advancing a bonding wire to said sonotrode and for severing the bonding wire,
  said bonding head being movable vertically in the direction of said sonotrode axis and rotatably about an axis parallel to the sonotrode axis and passing approximately through the weld surface at the foot of the sonotrode;
 (b) a cylindrical piece concentric with the axis of rotation of said bonding head and having a lower end face to which the bonding head is attached, said cylindrical piece have an eccentrically disposed bore running parallel to the axis of rotation of said bonding head, said bore having an axis;
 (c) bushing means for firmly holding said cylindrical piece;
 (d) flange means at an upper end of said cylindrical piece for engaging first drive means so as to vertically move said bonding head, said flange means having an eccentrically disposed bore running parallel to the axis of rotation of said bonding head;
 (e) radial bearing means for receiving said bushing means, said radial bearing means being adjustable without play, said radial bearing means including a ball-bearing cage, bearing balls and an inner race member with an upper end face and a lower end face, to permit longitudinal movement of said bushing means without play and such that said bearing means operates as a two-row angular-contact ball bearing;
 (f) drum means for accommodating electrical leads for the bonding head, said drum means being attached to the lower end face of the inner race member;
 (g) a toothed-belt pulley affixed to the upper end face of said inner race member;
 (h) a first rod eccentrically mounted on the drum means;
 (i) two rollers mounted on the bonding head and resting against said first rod;
 (j) a second rod mounted on the toothed-belt pulley;
 (k) a lever pivotally mounted with respect to said pulley;
 (l) spring means for holding a radial orientation of said lever with respect to the rotational axis of the bonding head;
 (m) transverse lug means on said lever for limiting the range of movement of said second rod;
 (n) fixed detent means for limiting rotational movement of the lever in one direction; and
 (o) a microscope objective screwed into a lower region of said bore in said cylindrical piece.

2. An apparatus according to claim 1; wherein
said apparatus further includes a semi-silvered mirror disposed in the bore in the cylindrical piece at a 45° angle to the axis of said bore in the cylindrical piece, said mirror having a center;
said radial bearing means includes an outer race member; and said bushing means, said ball-bearing cage, said inner race member and said outer race member each have a transverse bore at the height of the center of said mirror.

3. An apparatus according to claim 1; wherein said drum means includes a ridge which separates said drum means into two regions; said apparatus includes second drum means; and wherein an electrically inactive tensile cable and said electrical leads are each attached at respective ends thereof to the first-mentioned and second drum means and are partially guided and wound about said first-mentioned and second drum means in opposite directions, such that said electrically inactive tensile cable and said electrical leads each constitute a tensile cord of a closed tensile drive connected to the drum means.

4. An apparatus for ultrasonic wire bonding comprising:
 (a) a bonding head including
  (i) an ultrasound generator,
  (ii) a sonotrode having an axis and a foot which defines a weld surface, and
  (iii) gripping means for advancing a bonding wire to said sonotrode and for severing the bonding wire, said bonding head being movable vertically in the direction of said sonotrode axis and rotatably about an axis parallel to the sonotrode axis and passing approximately through the weld surface at the foot of the sonotrode;
 (b) a cylindrical piece concentric with the axis of rotation of said bonding head and having a lower end face to which the bonding head is attached;
 (c) bushing means for firmly holding said cylindrical piece;
 (d) flange means at an upper end of said cylindrical piece for engaging first drive means so as to vertically move said bonding head;
 (e) radial bearing means for receiving said bushing means and for permitting longitudinal movement of said bushing means without play and such that said bearing means operates as a two-row angular-contact ball bearing;
 (f) drum means for accommodating electrical leads for the bonding head, said drum means being attached to a lower end face of the radial bearing means;
 (g) a pulley affixed to an upper end face of said radial bearing means;
 (h) second drive means for rotating said bonding head; and
 (i) limiting means for limiting rotation of said pulley in one direction.

5. An apparatus according to claim 4; wherein said second drive means includes a rod eccentrically mounted on the drum means; and two rollers mounted on the bonding head and resting against said rod.

6. An apparatus according to claim 4; wherein said limiting means includes:
 (a) a rod mounted on the toothed-belt pulley;
 (b) a lever pivotally mounted with respect to said pulley;
 (c) spring means for holding a radial orientation of said lever with respect to the rotational axis of the bonding head;
 (d) an end member on said lever for limiting the range of movement of said rod, said end member being in the form of a transverse lug; and
 (e) fixed detent means for limiting rotational movement of the lever in one direction.

7. An apparatus according to claim 4; wherein said radial bearing means including a ball-bearing cage, bearing balls and an inner race member with an upper end face and a lower end face, to provide longitudinal movement of said bushing means.

8. An apparatus according to claim 7; wherein
 said cylindrical piece has an eccentrically mounted bore having an axis;
 said apparatus further includes a semi-silvered mirror disposed in the bore in the cylindrical piece at a 45° angle to the axis of said bore in the cylindrical piece, said mirror having a center;
 said radial bearing means includes an outer race member; and
 said bushing means, said ball-bearing cage, said inner race member and said outer race member each have a transverse bore at the height of the center of said mirror.

9. An apparatus according to claim 4; wherein said drum means includes a ridge which separates said drum means into two regions; and said apparatus includes second drum means; and wherein an electrically inactive tensile cable and said electrical leads are each attached at respective ends thereof to the first-mentioned and second drum means and are partially guided and wound about said first-mentioned and second drum means in opposite directions, such that said electrically inactive tensile cable and said electrical leads each constitute a tensile cord of a closed tensile drive connected to the drum means.

* * * * *